(12) United States Patent
Kulkarni

(10) Patent No.: US 9,300,257 B1
(45) Date of Patent: Mar. 29, 2016

(54) HIGH GAIN, HIGH SLEW RATE AMPLIFIER

(71) Applicant: ANALOG DEVICES TECHNOLOGY, Hamilton (BM)

(72) Inventor: Vinayak Mukund Kulkarni, Bangalore (IN)

(73) Assignee: ANALOG DEVICES GLOBAL, Hamilton (BM)

( * ) Notice: Subject to any disclaimer, the term of this patent is extended or adjusted under 35 U.S.C. 154(b) by 6 days.

(21) Appl. No.: 14/504,540

(22) Filed: Oct. 2, 2014

(51) Int. Cl.
H03F 3/45 (2006.01)
H03F 3/16 (2006.01)

(52) U.S. Cl.
CPC ............ *H03F 3/16* (2013.01); *H03F 2200/504* (2013.01); *H03F 2200/555* (2013.01)

(58) Field of Classification Search
USPC ......................................... 330/261, 253, 254
IPC ......................................................... H03F 3/45
See application file for complete search history.

(56) References Cited

U.S. PATENT DOCUMENTS

| | | | |
|---|---|---|---|
| 5,311,144 A | 5/1994 | Grasset | |
| 5,512,850 A | 4/1996 | Mo | |
| 6,310,520 B1 | 10/2001 | Walden | |
| 6,359,512 B1 | 3/2002 | Ivanov et al. | |
| 6,437,645 B1 | 8/2002 | Ivanov et al. | |
| 6,577,185 B1* | 6/2003 | Chandler | H03F 1/0277 330/133 |
| 8,390,379 B2 | 3/2013 | Snoeij et al. | |
| 2002/0190793 A1* | 12/2002 | Moon | H03F 3/3023 330/253 |
| 2009/0322429 A1* | 12/2009 | Ivanov | H03F 3/45179 330/257 |

OTHER PUBLICATIONS

Hong-Yi Huang et al., "High-Gain and High-Bandwidth Rail-to-Rail Operational Amplifier with Slew Rate Boost Circuit," Proceedings, 2006 IEEE International Symposium on Circuits and Systems (ISCAS 2006) vol. No. 21—May 24, 2006 (Island of Kos, Greece), 5 pages.

Shu Chen et al., "A low-power low-voltage slew-rate enhancement circuit for two-stage operational amplifiers," Journal of Semiconductors, vol. 33, No. 9, Sep. 2012, 095007-1 through 95007-6, 6 pages.

* cited by examiner

*Primary Examiner* — Patricia T Nguyen
(74) *Attorney, Agent, or Firm* — Patent Capital Group

(57) ABSTRACT

In an example embodiment, an amplifier having high gain and high slew rate is provided and includes a pair of input transistors to which input voltage is applied, a pair of diode-connected loads coupled to the input transistors, at least one pair of current sources coupled to the diode-connected loads, and a bias control configured to turn off the at least one pair of current sources to enable high slew rate for the amplifier and to turn on the at least one pair of current sources to enable high gain for the amplifier. In specific embodiments, the current sources include transistors, the bias control controls a bias voltage to the current sources, and the bias voltage is driven to the supply voltage ($V_{DD}$) to turn off the current sources.

20 Claims, 4 Drawing Sheets

HIGH GAIN, HIGH SLEW RATE AMPLIFIER

TECHNICAL FIELD OF THE DISCLOSURE

The present disclosure relates generally to electrical circuits and, more particularly, to a method and apparatus for a high gain, high slew-rate amplifier.

BACKGROUND

Differential amplifiers amplify (e.g., augment, increase, etc.) differential signals (e.g., signals measured as equal and opposite between two nodes). The factor by which the signals are amplified, called the amplifier's gain, is a measure of the ability of the amplifier to increase the power or amplitude of the signal from the input to the output. The gain is finite, and depends on the frequency of the input signal. At low frequency, the gain is maximum, usually decreases exponentially with increasing frequency, and has a value of one at the frequency commonly referred to as the unity-gain frequency. Generally, for an amplifier implemented in a given technology, the product of the amplifier's gain and maximum bandwidth is constant. Consequently, the design of the amplifier typically involves compromising between high gain and high bandwidth.

When the input to the amplifier changes too fast, the amplifier's slew rate, which is the maximum rate of change of the output voltage per unit of time (e.g., expressed as volt per second) slows the output. Changing of the output voltage over time for large input steps is generally referred to as "stewing." The slew rate of the amplifier, in general, decreases as gain increases, leading to a trade-off between gain and slew rate (e.g., higher the gain, lower the slew rate and vice versa). A high slew rate is generally a desirable characteristic of the amplifier; likewise, a high gain is also a desirable characteristics of the amplifier; however, amplifiers typically cannot be designed to provide both high slew rate and high gain.

One mechanism to achieve a high gain, high slew rate amplifier involves adding a positive current feedback circuit to a standard differential amplifier with resistive loads. The loop gain of the feedback circuit is configured to be smaller than unity and is controlled so as to ensure the stability of the entire unit. The load resistors are connected between a supply pole and the outputs of the differential amplifier and mounted in parallel with two current sources which apply their current feedback to the outputs. Another implementation of a high gain, high slew rate amplifier includes a primary amplifier combined with a secondary high power amplifier, which is activated only during brief periods, during which a very high slew rate is required.

In yet another implementation, a buffer circuit having both high gain and high slew rate is implemented using a high gain, low slew rate amplifier and a switch network with three separate phases of operation. During the first phase, the output of the amplifier is isolated from the load to allow the amplifier's output voltage to more quickly reach its final voltage level (e.g., achieving high slew rate). During the second phase, the switch network couples the amplifier output lead to the load input lead where the amplifier drives the voltage at the load's input lead to a voltage substantially equal to the voltage of the input signal (e.g., achieving high gain). During the third phase, the switch network isolates the amplifier from the load and couples the load's input lead to a source of ground potential to quickly slew the load's input lead to ground potential.

OVERVIEW

The present disclosure relates generally to a method and apparatus for a high gain, high slew-rate amplifier. In an example embodiment, an amplifier having high gain and high slew rate is provided and includes a pair of input transistors to which input voltage is applied, a pair of diode-connected loads coupled to the input transistors, at least one pair of current sources coupled to the diode-connected loads, and a bias control configured to turn off the at least one pair of current sources to enable high slew rate for the amplifier and to turn on the at least one pair of current sources to enable high gain for the amplifier. In specific embodiments, the current sources include transistors, the bias control controls a bias voltage to the current sources, and the bias voltage is driven to the supply voltage ($V_{DD}$) or ground (GND) to turn off the current sources.

DESCRIPTION OF EXAMPLE EMBODIMENTS OF THE DISCLOSURE

Figure 1:
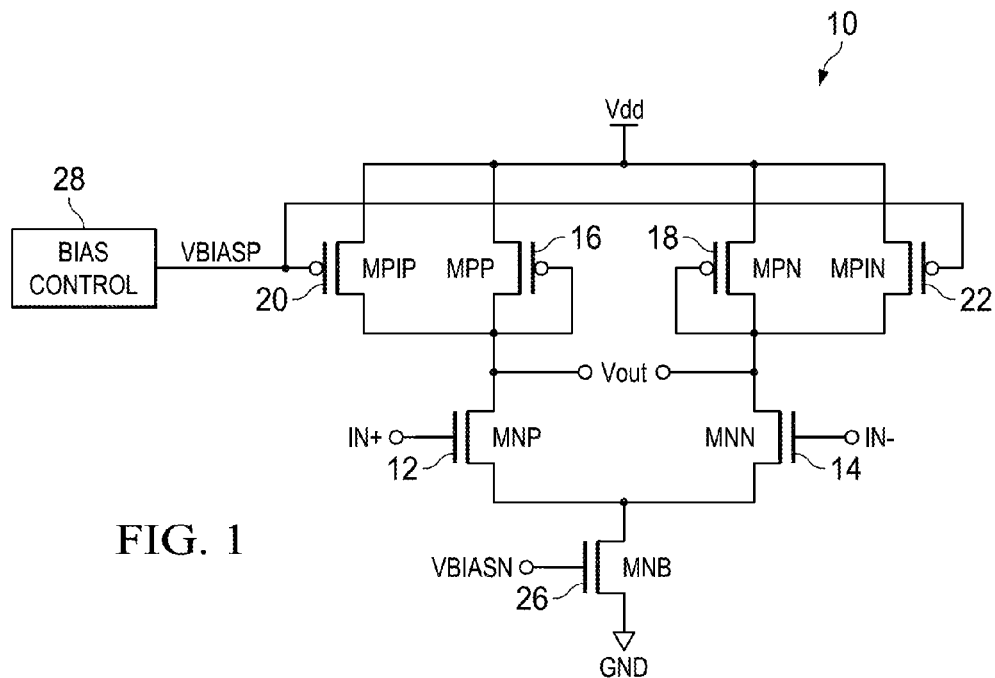
FIG. 1 is a simplified circuit diagram illustrating an example embodiment of a high gain high slew rate amplifier.

FIG. 1 is a simplified block diagram illustrating a high gain high slew rate amplifier 10. Amplifier 10 includes input transistors MNP 12 and MNN 14, at which input voltages $V_{in}$+ and $V_{in}$−, respectively, are applied. MNP 12 and MNN 14 are connected to transistors MPP 16 and MPN 18 that effectively act as diode connected loads. The use of diode-connected transistors as an active load provides a low gain, and diode-connected loads may consume voltage headroom (thus creating a trade-off between output voltage swings, voltage gain and input common mode range); however, diode connected loads have low impedance and can make the amplifier slew faster.

In a general sense, the gain of the amplifier is usually expressed as $A_v = G_m \times R_O$, where $G_m$ is transconductance (e.g., ratio of change in current at an output terminal to change in voltage at an input terminal of a device) of the input device and $R_O$ is the load impedance as seen by the input device (e.g., if an electric circuit has a well-defined output terminal, the circuit connected to the output terminal is the load; in a general sense, impedance is a measure of opposition that a circuit presents to a current when a voltage is applied). As used herein, the term "device" refers to an active electrical component of an electrical circuit, including transistors and diodes (in a general sense, the term is typically used for "active" components such as transistors, rather than for "passive" components, such as resistors). When $R_O$ is increased, the ability of the amplifier to change its output over the entire output range—in other words slewing—is decreased.

To achieve higher gain, the transconductance of MPP 16 and MPN 18 may be lowered, for example, by reducing current or aspect ratio (width to length ratio (W/L)) of MPP 16 and MPN 18. However, reducing current of load devices MPP 16 and MPN 18 is not feasible, as the current also powers input devices MNP 12 and MNN 14. Aspect ratio of MPP 16 and MPN 18 may be reduced; however, decreasing the aspect ratio can increase the drain-to-source voltage ($V_{DS}$) of load devices MPP 16 and MPN 18, causing input devices MNP 12 and MNN 14 to run out of saturation.

Because diode-connected loads MPP 16 and MPN 18 consume voltage headroom, part of the bias currents of input transistors MNP 12 and MNN 14 can be provided by current sources MPIP 20 and MPIN 22. For example, if MPIP 20 and MPIN 22 carry a majority of the drain current of MNP 12 and MNN 14, the current through MPP 16 and MPN 18 is reduced proportionally, potentially reducing transconductance of MPP 16 and MPN 18. Thus, the differential gain can be higher than that of the case with no current sources MPIP 20 and MPIN 22.

Moreover, current sources MPIP 20 and MPIN 22 may divert current from load devices MPP 16 and MPN 18, so that load devices MPP 16 and MPN 18 may be sized smaller without affecting the saturation of input devices MNP 12 and MNN 14. Gates of current sources MPIP 20 and MPIN 22 may be driven to a suitable bias voltage ($V_{BIASp}$) to enable operation as current sources. (Biasing is a method of establishing predetermined voltages or currents at various points of a circuit for establishing proper operating conditions; some devices may require a steady (DC) current or voltage to operate correctly even though they are processing analog (AC) current or voltage—the AC signal applied to them is superposed on the DC bias current or voltage.)

The higher gain with current sources MPIP 20 and MPIN 22 can result in reduced slew rate, which is reduced as the current sources MPIP 20 and MPIN 22 provide lower current for output nodes to change potential when the input terminals see a large voltage change. Therefore, in various embodiments, current sources MPIP 20 and MPIN 22 may be coupled to a bias control 24 that switches off current sources MPIP 20 and MPIN 22 during slewing and turns them on subsequently. Current sources MPIP 20 and MPIN 22 connected in parallel with load devices MPP 16 and MPN 18 can be turned on or off by controlling voltage $V_{BIASp}$ with bias control circuit 24. In an example embodiment, when amplifier 10 is slewing, bias control 24 can drive $V_{BIASp}$ close to $V_{DD}$ (supply voltage), thus turning-off MPIP 20 and MPIN 22 and making additional current available to change potential at the output nodes, thereby increasing slew rate. When amplifier 10 is not slewing, bias control 24 can drive $V_{BIASp}$ to its normal value to enable MPIP 20 and MPIN 22 to operate as current sources, with resulting high gain for amplifier 10. Note that a negative bias voltage ($V_{BIASn}$) may be supplied at another transistor MNB 26, which may also be connected to ground; load devices MPP 16 and MPN 18 may be connected to $V_{DD}$.

In various embodiments, bias control 24 can be implemented in any suitable manner according to various design considerations. Note that as the gain of amplifier 10 is changed using bias control 24, the stability of amplifier 10 may also change. Stability of amplifier 10 can be addressed by controlling values of amplifier compensation capacitors and/or resistors suitably. Note that in the circuit shown in the figure, input transistors MPP 12 and MPN 14, load devices MNP 16 and MNN 18, and current sources MNIP 20 and MNIN 22 are P-type metal oxide semiconductor (PMOS) transistors.

Figure 2:
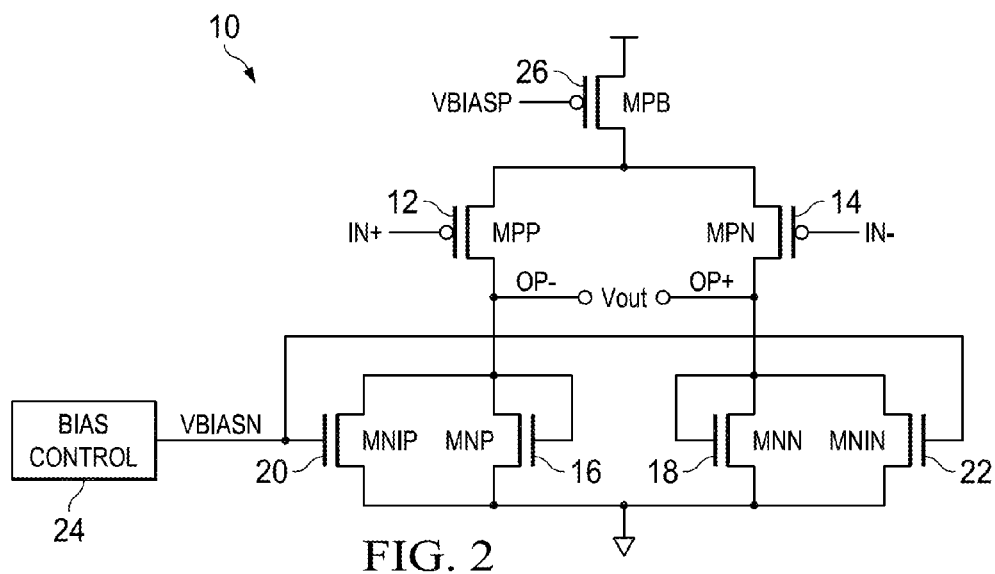
FIG. 2 is a simplified circuit diagram illustrating another example embodiment of the high gain high slew rate amplifier.

Turning to FIG. 2, FIG. 2 is a simplified circuit diagram illustrating another embodiment of amplifier 10. Input transistors MPP 12 and MPN 14 are P-type metal oxide semiconductor (PMOS) transistors and load devices MNP 16 and MNN 18, and current sources MNIP 20 and MNIN 22 are N-type metal oxide semiconductor (NMOS) transistors. Bias control 24 drives supply bias voltage $V_{BIASn}$ close to GND when amplifier 10 is slewing, thus turning off current sources MNIP 20 and MNIN 22. When amplifier 10 is not slewing, bias control 24 can drive $V_{BIASn}$ to its normal value to enable MNIP 20 and MNIN 22 to operate as current sources, with resulting high gain for amplifier 10.

Figure 3:
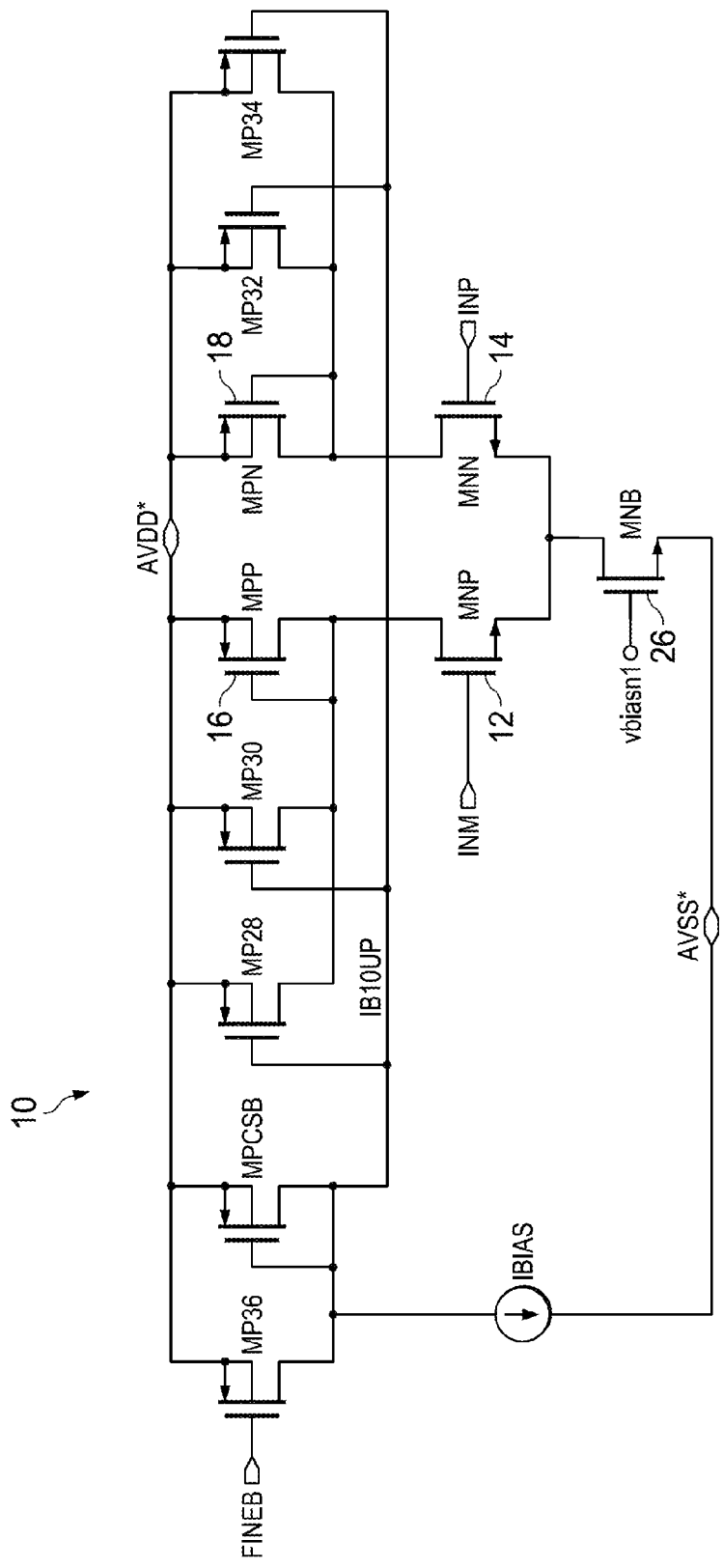
FIG. 3 is a simplified circuit diagram illustrating example details of an embodiment of the high gain high slew rate amplifier.

Turning to FIG. 3, FIG. 3 is a simplified circuit diagram illustrating example details of an embodiment of amplifier 10. Embodiments of amplifier 10 may be used in pre-charge buffers of certain analog-to-digital converters (ADCs). With embodiments of amplifier 10 in the pre-charge buffer, the increased gain does not worsen offsets (e.g., due to random mismatches) or decrease the slew rate of amplifier 10.

According to various embodiments, current sources MP 28, MP 30, MP 32 and MP 34 may be added in parallel with diode-loads MPP 16 and MPN 18. Current sources MP 28, MP 30, MP 32 and MP 34 in parallel can maintain offsets due to mismatch from diode-connected loads MPP 16 and MPN 18, for example, because offsets referred to input remain the same as without current sources MP 28, MP 30, MP 32 and MP 34. Also, current sources MP28, MP30, MP32 and MP34 can be sized such that they do not add input-referred offsets of their own. The added current sources can lower the transconductance $G_m$ of load devices MPP 16 and MPN 18 and consequently make amplifier gain higher. However the high gain is achieved at the cost of decreased slew rate, as current available to charge discharge capacitors (not shown) on output is much smaller. Therefore, transistor MP 36 may be added to act as a switch. When amplifier 10 is slewing, node fineb can be at low voltage, and subsequently all current sources MP 28, MP 30, MP 32 and MP 34 in parallel are turned-off and the entire current goes into charging the load capacitors. When slewing is finished, the voltage at node fineb can be increased, such that node vbiasn assumes gate voltage $V_{GS}$ to keep all current sources MP 28, MP 30, MP 32 and MP 34 turned on.

In some embodiments, the fineb signal need not be separately generated; any suitable signal that can indicate whether amplifier 10 is in coarse settling mode or fine settling mode may be used to control switch MP 36. For example, when an input voltage is applied, the output of the amplifier takes some time to reach a stable value over time. During slew time (i.e., coarse settling mode), the output of the amplifier moves at its highest possible speed towards the final voltage value. After slewing the output voltage might exhibit ringing depending on operating conditions and design of the amplifier. Signal fineb and switch MP 36 can allow fast slewing during coarse settling (e.g., when amplifier 10 is in slewing mode), and high gain during fine settling (e.g., when amplifier 10 is not in slewing mode). Note that the current sources MP 28, MP 30, MP 32 and MP 34 can remain turned on for the duration of the input voltage application to the amplifier.

When amplifier 10 changes from coarse settling mode to fine settling mode, current sources MP 28, MP 30, MP 32 and MP 34 are turned on, lowering $V_{GS}$ for diode loads MPP 16 and MPN 18. Note that lowering $V_{GS}$ can also lower $G_m$ of devices in the next stage of amplifier 10. However, the gain of the next stage remains unaffected, because lower $V_{GS}$ reduces $I_d$, and increases $R_{out}$. Thus, more current may be used in the next stage during coarse settling, whereas less current may be used in the next stage during in fine settling.

Figure 4:
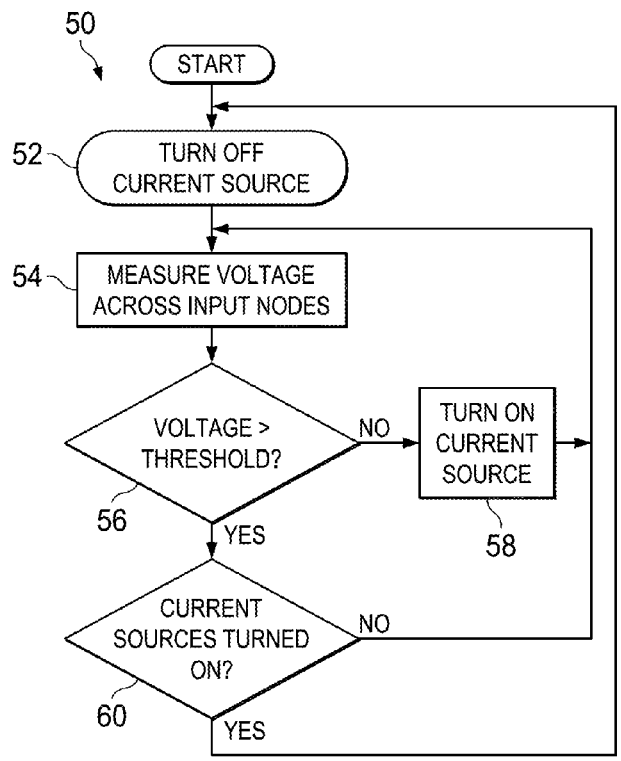
FIG. 4 is a simplified flow diagram illustrating example operations that may be associated with an embodiment of the high gain high slew rate amplifier.

Turning to FIG. 4, FIG. 4 is a simplified flow diagram illustrating example operations 50 that may be associated with embodiment of amplifier 10. At 52, the current sources (e.g., MPIP 20 and MPIN 22) may be turned off, for example, by bias control 24 driving $V_{BIASp}$ to $V_{DD}$. At 54, voltage $V_{IN}$ across input nodes may be measured. At 56, if voltage $V_{IN}$ is not greater than a predetermined voltage threshold, indicating that slewing is over, at 58, current sources (e.g., MPIP 20 and MPIN 22) may be turned on to achieve higher gain for amplifier 10. For example, voltage $V_{BIASp}$ may be decreased by bias control 24 to turn on the current sources (e.g., MPIP 20 and MPIN 22).

On the other hand, if it is determined that voltage $V_{IN}$ is greater than the predetermined voltage threshold at 56, a further determination may be made if the current sources (e.g., MPIP 20 and MPIN 22) are turned on at 60. If they are not turned on (e.g., as would be the case when amplifier is slewing after input voltage is applied), the operations may continue to 54, at which the output voltage is measured. On the other hand, if the current sources (e.g., MPIP 20 and MPIN 22) are turned on (e.g., as would be the case when the input voltage is turned off and amplifier starts to slew down), the operations revert to 52, at which the current sources (e.g., MPIP 20 and MPIN 22) may be turned off, for example, by bias control 24 lowering voltage $V_{BIASp}$ to $V_{DD}$.

Figure 5:
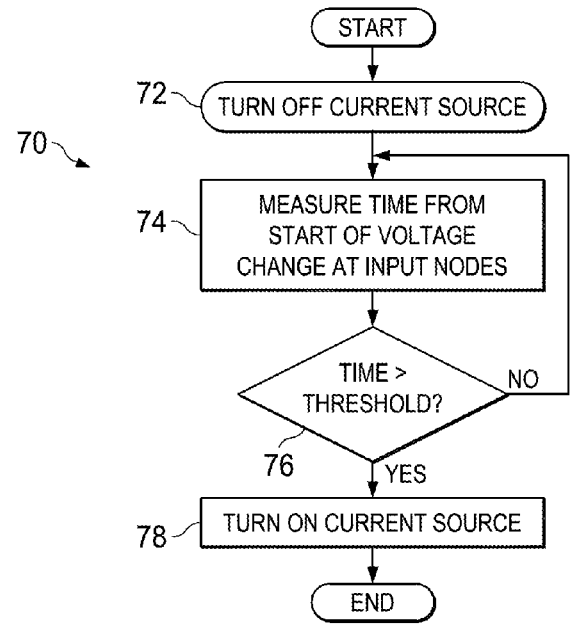
FIG. 5 is a simplified flow diagram illustrating other example operations that may be associated with an embodiment of the high gain high slew rate amplifier.

Turning to FIG. 5, FIG. 5 is a simplified flow diagram illustrating example operations 70 that may be associated with embodiment of amplifier 10. At 72, the current sources (e.g., MPIP 20 and MPIN 22) may be turned off, for example, by bias control 24 driving $V_{BIASp}$ to $V_{DD}$. Thereupon, amplifier 10 may achieve high slew rate. At 74, time from start of voltage change at input nodes (e.g., MNP 12 and MNN 14) may be measured (e.g., using any suitable timer). At 76, a determination may be made whether the measured time is greater than a predetermined time threshold (e.g., corresponding to end of slewing mode). For example, if the slew rate of amplifier 10 is known, the time taken to complete the slewing may be calculated and chosen to be the predetermined time threshold. If the measured time is greater than the predetermined time threshold, at 78, the current sources (e.g., MPIP 20 and MPIN 22) may be turned on, for example, by bias control 24 increasing $V_{BIASp}$. Thereupon, amplifier 10 may be achieve high gain. On the other hand, if the measured time is less than the predetermined time threshold, the operations may continue to measuring the time, at 74.

Figure 6:
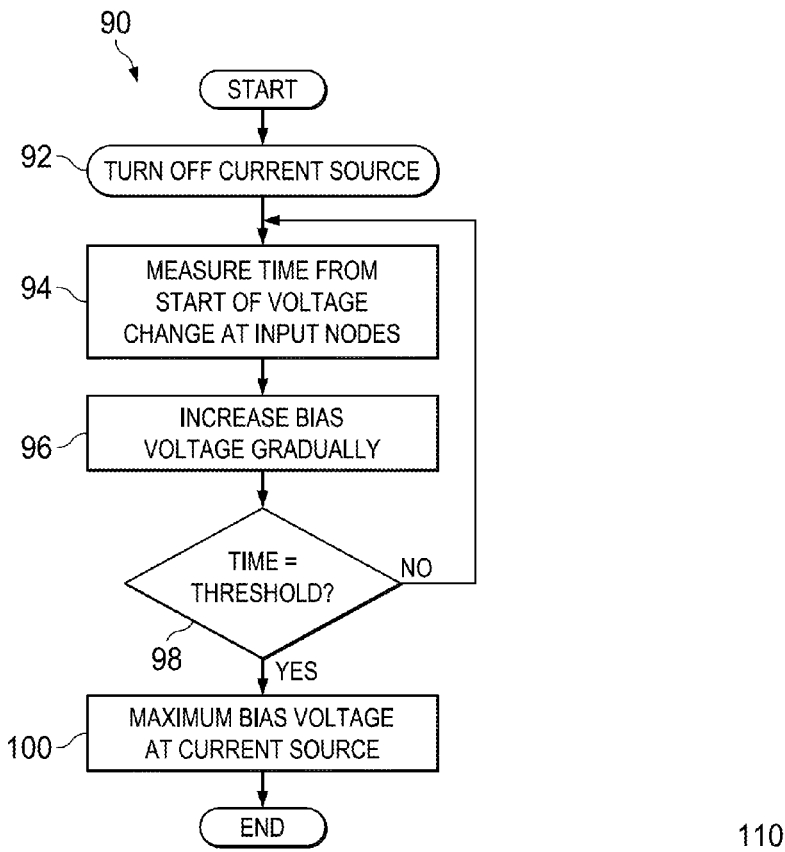
FIG. 6 is a simplified flow diagram illustrating yet other example operations that may be associated with an embodiment of the high gain high slew rate amplifier.

Turning to FIG. 6, FIG. 6 is a simplified flow diagram illustrating example operations 90 that may be associated with embodiment of amplifier 10. At 92, the current sources (e.g., MPIP 20 and MPIN 22) may be turned off, for example, by bias control 24 driving $V_{BIASp}$ to $V_{DD}$. Thereupon, amplifier 10 may achieve high slew rate. At 94, time from start of voltage change at input nodes (e.g., MNP 12 and MNN 14) may be measured (e.g., using any suitable timer). At 96, bias control 24 may increase bias voltage $V_{BIASp}$ gradually. At 98, a determination may be made whether the measured time is greater than a predetermined time threshold (e.g., corresponding to end of slewing mode). If so, at 100, bias control 24 may apply a maximum bias voltage $V_{BIASp}$ at the current sources (e.g., MPIP 20 and MPIN 22). On the other hand, if the time measured is not greater than the predetermined time threshold (e.g., amplifier 10 is in slewing mode), the operations may revert to measuring time, at 94.

Figure 7:
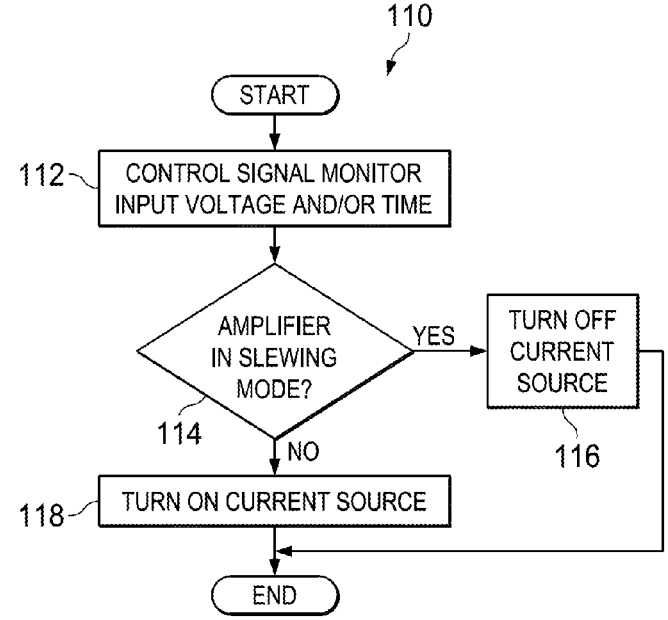
FIG. 7 is a simplified flow diagram illustrating yet other example operations that may be associated with an embodiment of the high gain high slew rate amplifier.

Turning to FIG. 7, FIG. 7 is a simplified flow diagram illustrating example operations 110 that may be associated with embodiment of amplifier 10. At 112, a control signal (e.g., voltage fineb) may monitor the input voltage or the time elapsed since start of change of input voltage. At 114, a determination may be made whether amplifier 10 is in slewing mode. If amplifier 10 is in slewing mode, at 116, the current sources (e.g., MP 28, MP 30, MP 32 and MP 34) may be turned off (e.g., by turning off switch MP 36), to increase slew rate. On the other hand, if amplifier 10 is not in slewing mode, at 118, the current sources (e.g., MP 28, MP 30, MP 32 and MP 34) may be turned on (e.g., by turning on switch MP 36), to increase gain.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

In the discussions of the embodiments above, circuit components, such as capacitors, clocks, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic chips, hardware, software, etc. offer an equally viable option for implementing the teachings of the present disclosure.

In one example embodiment, any number of electrical circuits of the FIGURES may be implemented on a board of an associated electronic chip. The board can be a general circuit board that can hold various components of the internal electronic system of the electronic chip and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and other peripheral chips may be attached to the board as plug-in cards, via cables, or integrated into the board itself.

In another example embodiment, the electrical circuits of the FIGURES may be implemented as stand-alone modules (e.g., a chip with associated components and circuitry configured to perform a specific application or function) or implemented as plug-in modules into application specific hardware of electronic chips. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities as described herein may be implemented in one or more silicon cores in Application Specific Integrated Circuits (ASICs), Field Programmable Gate Arrays (FPGAs), and other semiconductor chips. In various other embodiments, the functionalities described herein may be implemented in emulation form as software or firmware running within one or more configurable (e.g., programmable) elements arranged in a structure that supports these functions.

It is also imperative to note that all of the specifications, dimensions, and relationships outlined herein (e.g., the number of components, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that rely on signals to execute specialized software programs, or algorithms, some of which may be associated with processing digitized real-time data. Certain embodiments can relate to automotive applications, such as battery power sensors and related accessories. Certain other embodiments can relate to multi-DSP signal processing, floating point processing, signal/control processing, fixed-function processing, microcontroller applications, etc. In certain contexts, the features discussed herein can be applicable to automotive systems, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can apply the functionalities described herein in high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the electrical circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media chip). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments. In a first example, a system is provided (that can include any suitable circuitry, dividers, capacitors, resistors, inductors, ADCs, DFFs, logic gates, software, hardware, links, etc.) that can be part of any type of electronic device (e.g., computer), which can further include a circuit board coupled to a plurality of electronic components. The system includes a high gain, high slew rate amplifier that includes a pair of input transistors to which input voltage is applied, a pair of diode-connected loads coupled to the input transistors, at least one pair of current sources coupled to the diode-connected loads, and a bias control.

The amplifier includes means for turning off the current sources with the bias control when the amplifier is slewing; and means for turning on the current sources with the bias control when the amplifier is not slewing; means for gradually increasing bias voltage to the current sources with the bias control when the amplifier is slewing to gradually turn on the current sources; means for applying the input voltage to the input transistors; means for measuring time starting from application of the input voltage; and means for turning on the current sources with the bias control when the measured time exceeds a predetermined time threshold, for example, corresponding to an end of amplifier slewing. The amplifier can further include means for measuring output voltage of the amplifier; and means for turning on the current sources with the bias control when the measured voltage exceeds a predetermined voltage threshold.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. An amplifier with high gain and high slew rate, comprising:
   a pair of input transistors to which input voltage is applied;
   a pair of diode-connected loads coupled to the input transistors;
   at least one pair of current sources coupled to the diode-connected loads; and
   a bias control configured to turn off the at least one pair of current sources to enable high slew rate for the amplifier and to turn on the at least one pair of current sources to enable high gain for the amplifier.

2. The amplifier of claim 1, wherein the bias control turns off the current sources during a coarse settling mode of the amplifier when the amplifier is slewing, wherein the bias control turns on the current sources at the end of slewing and keeps the current sources turned on when the amplifier is not slewing.

3. The amplifier of claim 1, wherein the current sources comprise transistors, wherein the bias control controls a bias voltage to the current sources, wherein the bias voltage is driven to the supply voltage ($V_{DD}$) to turn off the current sources.

4. The amplifier of claim 1, wherein the bias control gradually increases the bias voltage when the amplifier is slewing to gradually turn on the current sources.

5. The amplifier of claim 1, wherein the bias control includes a transistor switch coupled to the current sources, wherein when the transistor switch is turned on the current sources are turned on, wherein when the transistor switch is turned off the current sources are turned off.

6. The amplifier of claim 1, wherein when a time measured from a start of application of the input voltage to the input transistors is below a predetermined time threshold, the bias control turns off the current sources, and when the measured time is above the predetermined time threshold, the bias control turns on the current sources.

7. The amplifier of claim 6, wherein the predetermined time threshold corresponds to an end of slewing of the amplifier.

8. The amplifier of claim 1, wherein when the output voltage of the amplifier is below a predetermined voltage threshold, the bias control turns off the current sources, and when the output voltage of the amplifier is above a predetermined voltage threshold, the bias control turns on the current sources.

9. The amplifier of claim 1, wherein the amplifier is used in a pre-charge buffer of a analog to digital converter (ADC).

10. The amplifier of claim 1, wherein the input transistors, the diode-connected loads and the current sources comprise P-type Metal Oxide Semiconductor (PMOS) transistors.

11. The amplifier of claim 1, wherein the input transistors comprise PMOS transistors and the diode-connected loads and the current sources comprise N-type Metal Oxide Semiconductor (NMOS) transistors.

12. A method for enabling a high gain, high slew amplifier comprising a pair of input transistors to which input voltage is applied, a pair of diode-connected loads coupled to the input transistors, at least one pair of current sources coupled to the diode-connected loads, and a bias control, the method comprising:
    turning off the current sources with the bias control when the amplifier is slewing; and
    turning on the current sources with the bias control when the amplifier is not slewing.

13. The method of claim 12, wherein the current sources comprise transistors, wherein the bias control controls a bias voltage to the current sources, wherein the bias voltage is driven to the supply voltage ($V_{DD}$) to turn off the current sources.

14. The method of claim 13, further comprising gradually increasing the bias voltage with the bias control when the amplifier is slewing to gradually turn on the current sources.

15. The method of claim 12, wherein the bias control includes a transistor switch coupled to the current sources, wherein when the transistor switch is turned on the current sources are turned on, wherein when the transistor switch is turned off the current sources are turned off.

16. The method of claim 12, further comprising:
    turning off the current sources with the bias control;
    applying the input voltage to the input transistors;
    measuring time starting from application of the input voltage; and
    turning on the current sources with the bias control when the measured time exceeds a predetermined time threshold.

17. The method of claim 16, wherein the predetermined time threshold corresponds to an end of amplifier slewing.

18. The method of claim 12, further comprising:
    turning off the current sources with the bias control;
    applying the input voltage to the input transistors;
    measuring output voltage of the amplifier; and
    turning on the current sources with the bias control when the measured voltage exceeds a predetermined voltage threshold.

19. The method of claim 12, wherein the input transistors, the diode-connected loads and the current sources comprise PMOS transistors.

20. The method of claim 12, wherein the input transistors comprise PMOS transistors and the diode-connected loads and the current sources comprise NMOS transistors.

* * * * *